US010761386B2

(12) United States Patent
Zhang et al.

(10) Patent No.: US 10,761,386 B2
(45) Date of Patent: Sep. 1, 2020

(54) DISPLAY PANEL AND DISPLAY DEVICE

(71) Applicant: Shanghai Tianma Micro-Electronics Co., Ltd., Shanghai (CN)

(72) Inventors: Min Zhang, Shanghai (CN); Xiangjian Kong, Shanghai (CN)

(73) Assignee: SHANGHAI TIANMA MICRO-ELECTRONICS CO., LTD., Shanghai (CN)

(*) Notice: Subject to any disclaimer, the term of this patent is extended or adjusted under 35 U.S.C. 154(b) by 183 days.

(21) Appl. No.: 16/129,883

(22) Filed: Sep. 13, 2018

(65) Prior Publication Data
US 2019/0237487 A1 Aug. 1, 2019

(30) Foreign Application Priority Data
Jan. 31, 2018 (CN) .......................... 2018 1 0094091

(51) Int. Cl.
G02F 1/1362 (2006.01)
H01L 27/12 (2006.01)
G02F 1/1335 (2006.01)
G02F 1/1368 (2006.01)
G02F 1/1343 (2006.01)

(52) U.S. Cl.
CPC ...... G02F 1/136286 (2013.01); G02F 1/1368 (2013.01); G02F 1/13439 (2013.01); G02F 1/133553 (2013.01); G02F 1/136213 (2013.01); H01L 27/124 (2013.01); H01L 27/1218 (2013.01); H01L 27/1255 (2013.01); H01L 27/1262 (2013.01); *G02F 2201/56* (2013.01);

(Continued)

(58) Field of Classification Search
CPC .............. H01L 27/124; H01L 27/1218; G02F 1/136286; G02F 1/133553; G02F 2203/02; G02F 2203/09; G02F 2201/56; G09G 2300/0426
See application file for complete search history.

(56) References Cited

U.S. PATENT DOCUMENTS

2009/0102758 A1* 4/2009 Anzai .................. G09G 3/3677
345/76
2016/0291406 A1* 10/2016 Zuo .................. G02F 1/133555
(Continued)

FOREIGN PATENT DOCUMENTS

CN 104916252 A 9/2015
CN 107077033 A 8/2017

*Primary Examiner* — Jia X Pan
(74) *Attorney, Agent, or Firm* — Tarolli, Sundheim, Covell & Tummino LLP

(57) ABSTRACT

The present disclosure is related to a display panel and a display device. The non-display area of the display panel includes a chip bonding area, the display area includes first and second display areas. The display area includes sub-pixels and reflective layer portions, projection of reflective layer portion corresponds to opening region of sub-pixel. The display area further includes first and second signal lines. The second signal lines are connected to the first signal lines and the chip bonding area, and each includes first and second lines. The first line is connected to the first signal lines and the chip bonding area through the second line, and arranged in the second display area and extends along a column direction. A projection of first line overlaps a projection of reflective layer portion. The second lines are arranged in the non-display area.

15 Claims, 9 Drawing Sheets

(52) U.S. Cl.
CPC ...... *G02F 2203/02* (2013.01); *G02F 2203/09* (2013.01)

(56) References Cited

U.S. PATENT DOCUMENTS

2017/0115542 A1* 4/2017 Oh .................... G02F 1/136286
2018/0031898 A1* 2/2018 Tanaka .................. G02B 6/005

\* cited by examiner

DISPLAY PANEL AND DISPLAY DEVICE

CROSS-REFERENCE TO RELATED APPLICATIONS

The present application claims the benefit of priority to Chinese Patent Application No. 201810094091.8, filed on Jan. 31, 2018, the content of which is incorporated herein by reference in its entirety.

TECHNICAL FIELD

The present disclosure relates to the field of display technologies, and particularly, to a display panel and a display device.

BACKGROUND

In conventional display devices, the display panel generally has a rectangular structure. However, with the development of display technology and peoples' requirements on diversity of the shape of the display devices, special-shaped display panels are more widely applied than ever. Taking the display panel having a round shape shown in FIG. 1 as an example, the display panel includes a display area 1' and a non-display area 2'. The display area 1' has a plurality of first signal lines 3' arranged therein, and the plurality of first signal lines 3' is each connected to a chip bonding area 5' through a second signal line 4' arranged in the non-display area 2'. A driving chip bonded in the chip bonding area 5' provides driving signals for driving pixels to emit light, and the driving signals are transmitted to corresponding pixels through the second signal lines 4' and the first signal lines 3'.

However, in this arrangement, the second signal lines 4' will occupy a relative large space in the non-display area 2', which may lead to a wide frame and thus is adverse to a narrow frame design of the display device.

SUMMARY

In view of the above, embodiments of the present disclosure provide a display panel and a display device, so as to reduce the frame width, thereby better achieving the design of narrow frame of the display device.

In an aspect, the embodiments of the present disclosure provide a display panel. The display panel includes a display area and a non-display area. The non-display area includes a chip bonding area, and the display area includes a first display area and a second display area. A distance between the second display area and the chip bonding area is smaller than a distance between the first display area and the chip bonding area. The display panel includes a plurality of reflective layer portions arranged in the display area, an orthogonal projection of each of the plurality of reflective layer portions on a plane where the display panel is located corresponds to an opening region of a sub-pixel. The display panel includes a plurality of first signal lines arranged in the display area, and each of the plurality of first signal lines has different lengths in the display area. The display panel further includes a plurality of second signal lines connected to the plurality of first signal lines in one-to-one correspondence, and the plurality of second signal lines is also connected to the chip bonding area. At least a portion of the plurality of second signal lines each at least comprises a first line and a second line, the first line is connected to a corresponding first signal line of the plurality of the first signal lines, and is further connected to the chip bonding area through the second line. The first line is located in the second display area and extends along a column direction, an orthogonal projection of the first line on the plane where the display panel is located partially overlaps an orthogonal projection of a corresponding reflective layer portion of the plurality of reflective layer portions on the plane where the display panel is located, and the second line is located in the non-display area.

In another aspect, the embodiments of the present disclosure provide a display device, including the above display panel, and a driving chip bonded in the chip bonding area of the display panel.

BRIEF DESCRIPTION OF DRAWINGS

In order to more clearly illustrate technical solutions of embodiments of the present disclosure, the accompanying drawings used in the embodiments will be briefly introduced hereinafter. Obviously, the drawings described only illustrate some of the embodiments of the present disclosure, those skilled in the art can also obtain other drawings based on these drawings without creative efforts.

DESCRIPTION OF EMBODIMENTS

For better understanding of technical solutions of the present disclosure, the embodiments of the present disclosure will be illustrated in detail with reference to the accompanying drawings.

It should be understood that, the described embodiments are only a portion of the embodiments of the present disclosure, rather than all of them. Based on the embodiments of the present disclosure, any other embodiments obtained by those of ordinary skill in the art shall fall within the protection scope of the present disclosure.

The terms used in the embodiments of the present disclosure are merely for the purpose of describing specific embodiments, rather than limiting the present disclosure. The singular form "a", "an", "the" or "said" used in the embodiments and claims shall be interpreted as also including the plural form, unless otherwise clearly noted in the context.

It should be understood that, the term "and/or" used in the present disclosure merely refers to a relation between associated objects, that is, including three types of relations. For example, A and/or B refers to: (a) A exists alone; (b) A and B exist at the same time; or (c) B exists alone. In addition, the character "/" generally refers to an "or" relation.

It should be understood that, although expressions "first", "second", etc. are used to describe specific signal lines, they shall not be interpreted as a limitation of the specific signal lines. These expressions are merely used to distinguish the specific signal lines. For example, without departing from the scope of the present disclosure, a first signal line can also be referred as a second signal line, and vice versa.

Figure 2:
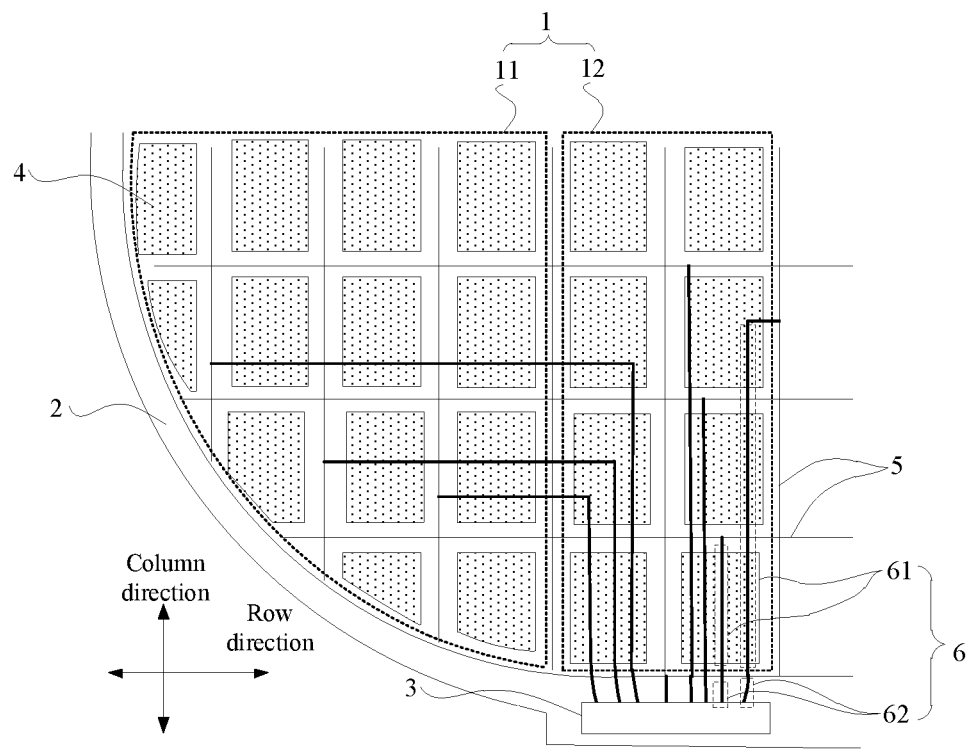
FIG. 2 is a schematic structural diagram of a portion of a display panel according to an embodiment of the present disclosure.

An embodiment of the present disclosure provides a display panel, as shown in FIG. 2. The display panel includes a display area 1 and a non-display area 2. A chip bonding area 3 for bonding a driving chip is arranged in the non-display area 2. The display area 1 includes a first display area 11 and a second display area 12. A distance between the second display area 12 and the chip bonding area 3 is smaller than a distance between the first display area 11 and the chip bonding area 3.

The display area 1 of the display panel has a plurality of reflective layer portions 4, an orthogonal projection of each of the plurality of reflective layer portions 4 on a plane where the display panel is located corresponds to an opening region of a sub-pixel (not shown).

In addition, the display area 1 further has a plurality of first signal lines 5 arranged therein, and the plurality of first signal lines 5 has different lengths in the display area 1. The display panel further includes a plurality of second signal lines 6 connected to the plurality of first signal lines 5 in one-to-one correspondence, and the plurality of second signal lines 6 is further connected to the chip bonding area 3. When the display panel is displaying an image, the driving chip provides driving signals for driving the sub-pixels to emit light. The driving signals are transmitted to the first signal lines 5 through the second signal lines 6, and are further transmitted to corresponding sub-pixels, so as to drive the sub-pixels to emit light. For example, when the first signal lines 5 include gate lines, the driving signal is a scan signal, and when the first signal line 5 includes a data line, the driving signal is a data signal.

At least a portion of the plurality of second signal lines 6 each includes a first line 61 and a second line 62. The first line 61 is connected to a corresponding first signal line 5, and is connected to the chip bonding area 3 through the second line 62. The first line 61 is located in the second display area 12 and extends along a column direction. An orthogonal projection of the first line 61 on the plane where the display panel is located partially overlaps an orthogonal projection of the reflective layer portion 4 on the plane where the display panel is located. The second line 62 is located in the non-display area 2.

Figure 3:
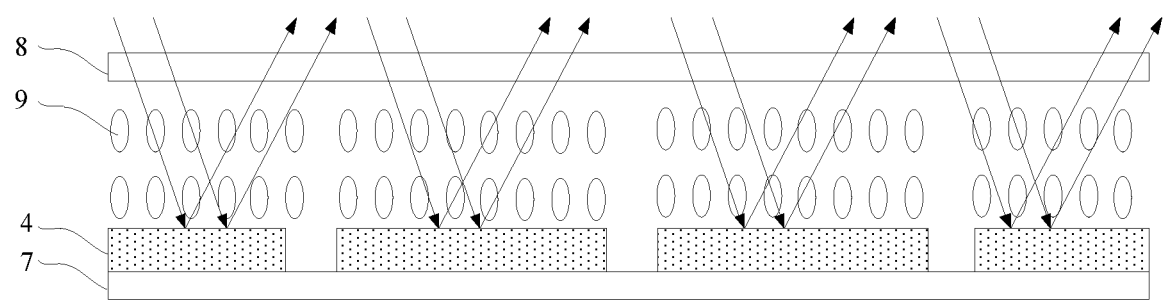
FIG. 3 is a schematic structural diagram of a total reflective display panel according to an embodiment of the present disclosure.
Figure 4:
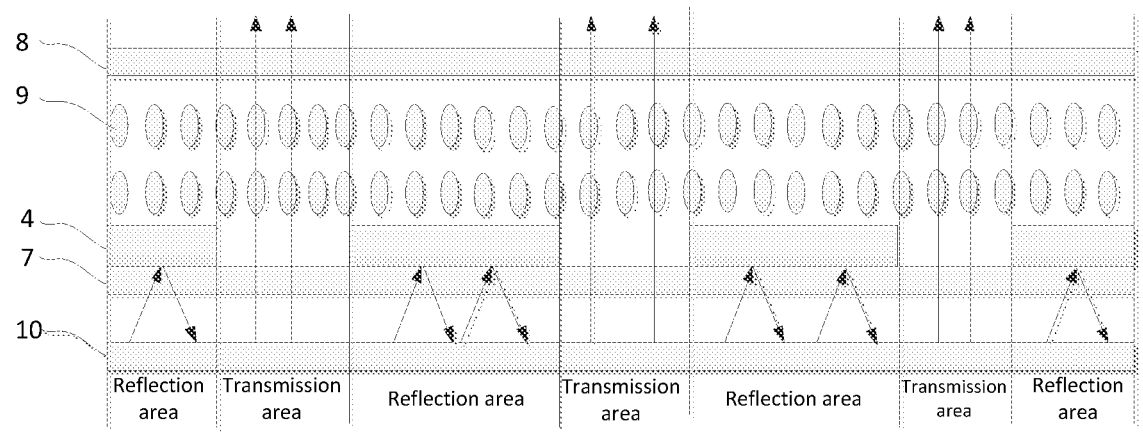
FIG. 4 is a schematic structural diagram of a transflective display panel according to an embodiment of the present disclosure.
Figure 5:
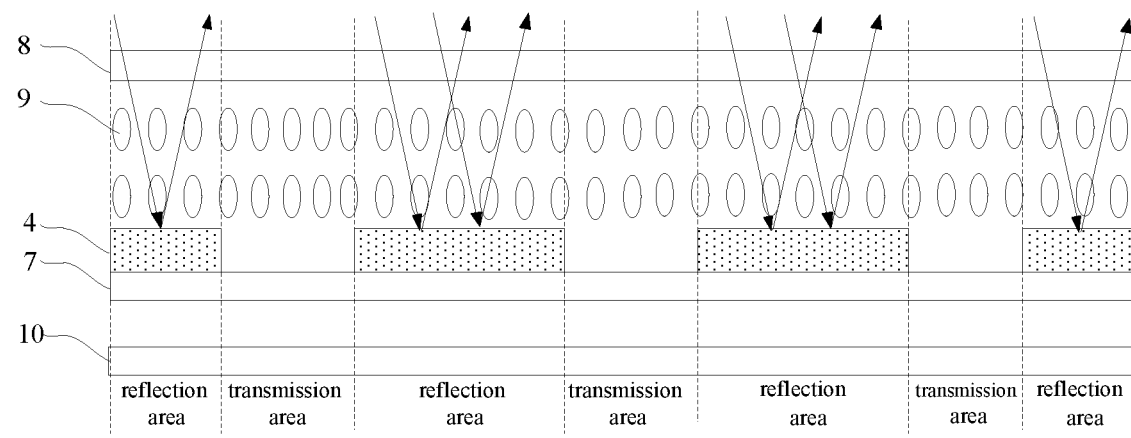
FIG. 5 is another schematic structural diagram of a transflective display panel according to an embodiment of the present disclosure.

It should be noted that, the display panel provided in the present embodiment is a reflective display panel having a plurality of reflective layer portions 4. Taking a liquid crystal display panel as an example, as shown in FIGS. 3-5, the display panel includes an array substrate 7 and a color film substrate 8 opposite to the array substrate 7. The plurality of reflective layer portions 4 is arranged on the array substrate 7. Liquid crystal 9 is filled between the reflective layer portions 4 and the color film substrate 8.

Please refer to FIG. 3, when the display panel is a total reflective display panel, each reflective layer portion 4 corresponds to a complete opening of a sub-pixel, once ambient light is incident on the display panel, the light is reflected on the reflective layer portion 4 and emitted out via a color film layer 8, thereby completing an image display. As regards the total reflective display panel, the display panel achieves the image display by utilizing ambient light, without providing a back light source.

Referring to FIG. 4 and FIG. 5, when the display panel is a transflective display panel, an opening of a sub-pixel includes a transmission area and a reflection area, and the reflective layer portion 4 corresponds to the reflection area of the opening of the sub-pixel. As for the transflective display panel, it is necessary to provide a back light source 10 in the display panel. As shown in FIG. 4, in a transmission mode, one portion of the back light emitted from the back light source 10 passes through the transmission area and then is emitted out through the color film substrate 8, while the other portion of the back light is reflected by the reflective layer portion 4. As shown in FIG. 5, in a reflection mode, when ambient light is incident on the display panel, then reflected on the reflective layer portion 4 and is emitted through the color film substrate 8.

On the basis of the above, for a reflective display panel, the ambient light is incident from one side of the reflective layer portion 4 and is emitted out from the same side after being reflected by the reflective layer portion 4. In the present embodiment, although the first line 61 is arranged in the second display area 12, the first line 61 can be arranged at a side of the reflective layer portion 4 facing away from the incident ambient light to avoid the possible influence of the ambient light on the first lines 61. In addition, the orthogonal projection of the first line 61 on the plane where the display panel is located partially overlaps the orthogonal projection of the reflective layer portion 4 on the plane where the display panel is located. By adopting this arrangement, the arrangement of the first lines 61 will not influence the reflectivity of the ambient light, whether the display panel is total reflective or transflective.

Figure 1:
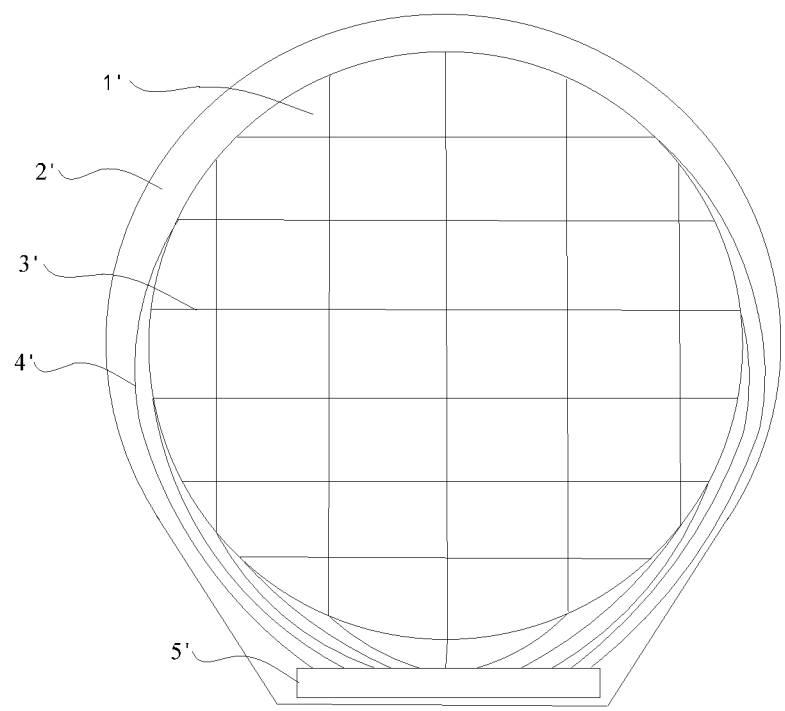
FIG. 1 is a schematic structural diagram of a display panel according to the related art.

In the related art shown in FIG. 1, each of the second signal lines 4' is connected to an end of the first signal line 3'. In this way, the second signal lines 4' are distributed at two side portions of the non-display area 2', so that the second signal lines occupy a relative large space of the non-display area 2', thereby resulting in a wide frame of the non-display area 2'. In the present embodiment, since the second signal line 6 includes a first line 61 and a second line 62, the first line 61 is arranged in the second display area 12 to be connected to the first signal line 5 and extends along the column direction. In this way, the second line 62 connected to the first line 61 can be concentrated in a region of the non-display area 2 corresponding to the second display area 12. By adopting this arrangement, the second line 62 is only arranged in a region of the non-display area 2 between the chip bonding area 3 and the second display area 12, without occupying other regions of the non-display area 2. Therefore, the space occupied by the lines in the non-display area 2 is reduced, which reduces a width of the frame and then achieves the narrow frame design.

It should be understood that, in the second display area 12, the number of first lines 61 arranged in each sub-pixel depends on the area of the reflective layer portion 4 corresponding to the sub-pixel. If the area of the corresponding reflective layer portion 4 of the sub-pixel is relatively large, more first lines 61 can be provided. On the contrary, if the area of the corresponding reflective layer portion 4 of the sub-pixel is relatively small, less first lines 61 should be arranged thereon.

It should be noted that, the display panel provided in the embodiments of the present disclosure is not limited to total reflective or transflective, other types of reflective display panels are also possible, as long as they can display images using ambient light.

Figure 6:
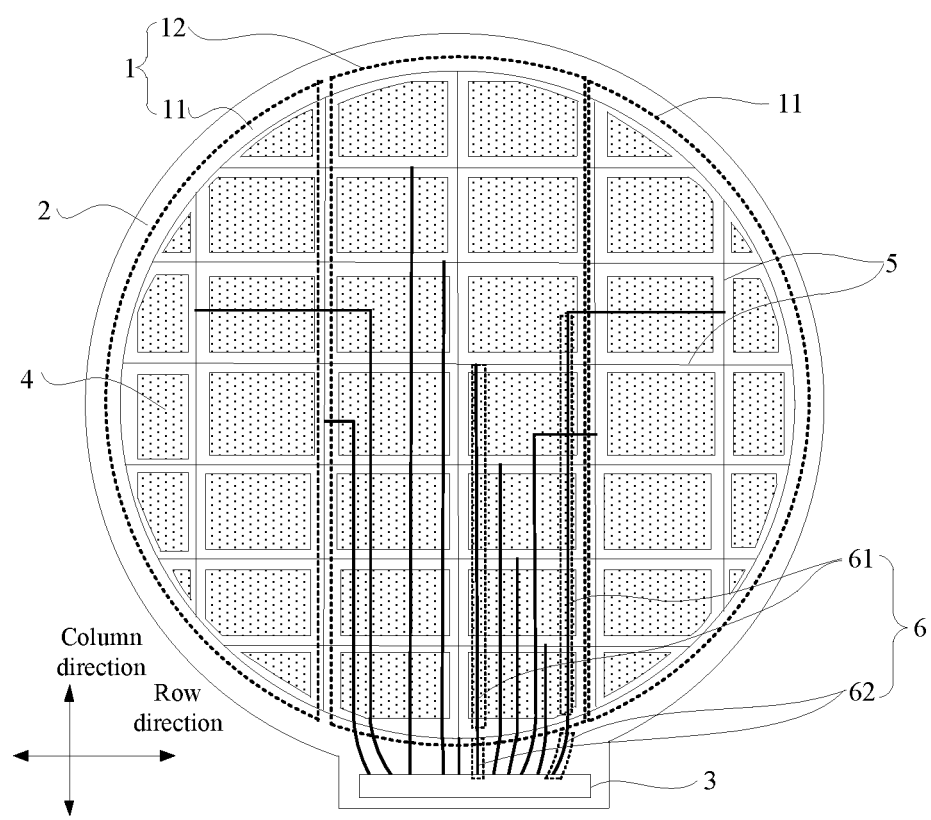
FIG. 6 is a schematic structural diagram of a display panel according to an embodiment of the present disclosure.

At present, for a wearable display device, the display panel generally has a round shape. As shown in FIG. 6, when the display area 1 of the display panel has a round shape, the display panel 1 includes two first display areas 11 and one second display area 12. In the row direction, one first display area 11, the second display area 12 and the other first display area 11 are arranged in sequence.

As regards a display panel having a round display area 1 in the related art, still referring to FIG. 1, in the related art, according to the arrangement of the second signal lines 4', in the non-display area 2', the closer to the chip bonding area 5', there are more the second signal lines 4'. This may lead to a wide frame at lower portion of the display panel, and there would be an obvious beveled edge in the chip. In this way, the round display panel in the related art cannot sufficiently achieve the effect similar to that of a true shape, so that it is called as "pseudo true round".

In the present embodiment, still referring to FIG. 6, based on the arrangement of the first lines 61, the second lines 62 connected to the first lines 61 are only needed to be concentrated in a region of the non-display area 2 between the chip bonding area 3 and the second display area 12, which can not only reduce the width of the entire frame, but also avoid the beveled edge at the lower portion of the frame in the related art. In addition, since the second lines 62 are concentrated in a certain region, a distance between pins in the chip bonding area 3 connected to the second lines 62 can be set smaller, so as to reduce the length of the chip bonding area 3 in a row direction, i.e., to reduce the space occupied by the chip bonding area 3 in the non-display area 2. Therefore, by utilizing the display panel provided in the embodiment of the present disclosure, the frame of the display panel more likely approaches a true round, which is more adaptive to a wearable display device.

In an embodiment, the first signal line 5 can include a gate line and/or a data line. When the gate line is connected to the chip bonding area 3, the driving chip bonded in the chip bonding area 3 outputs scan signal, and the scan signal is transmitted to a corresponding gate line through the second signal line 6 connected to this gate line. When the data lines are connected to the chip bonding area 3, the driving chip outputs data signal, and the data signal is transmitted to a corresponding data line through the second signal line 6 connected to this data line.

Figure 7:
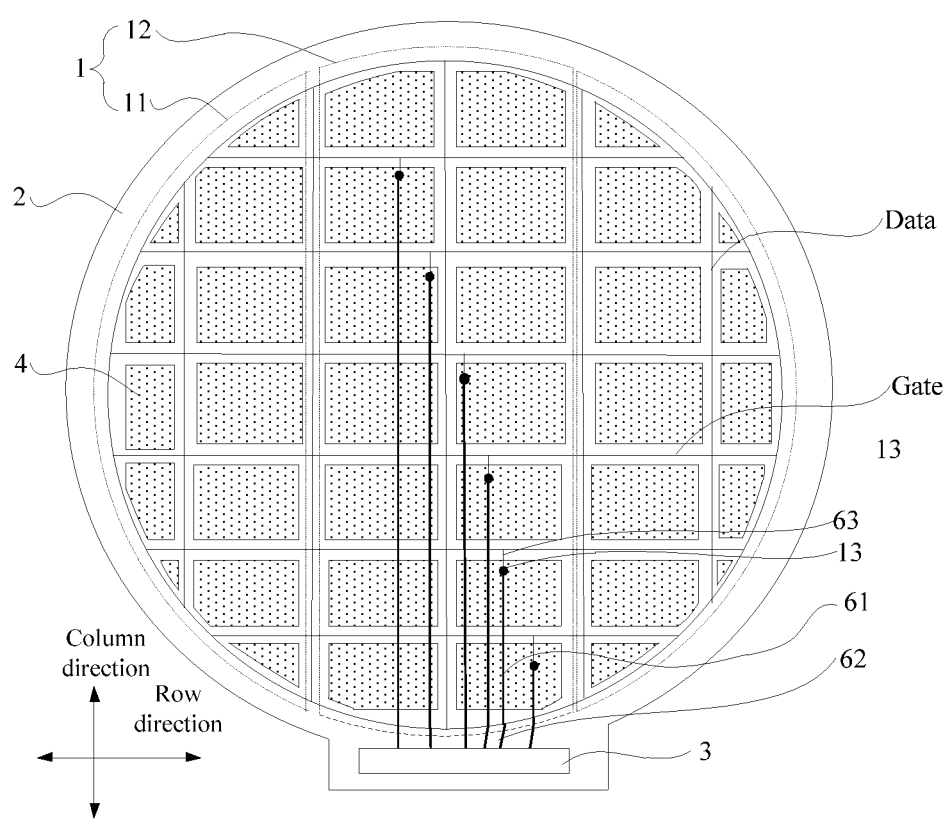
FIG. 7 is a schematic diagram of a connection between a first signal line and a second signal line in a display panel according to an embodiment of the present disclosure.
Figure 8:
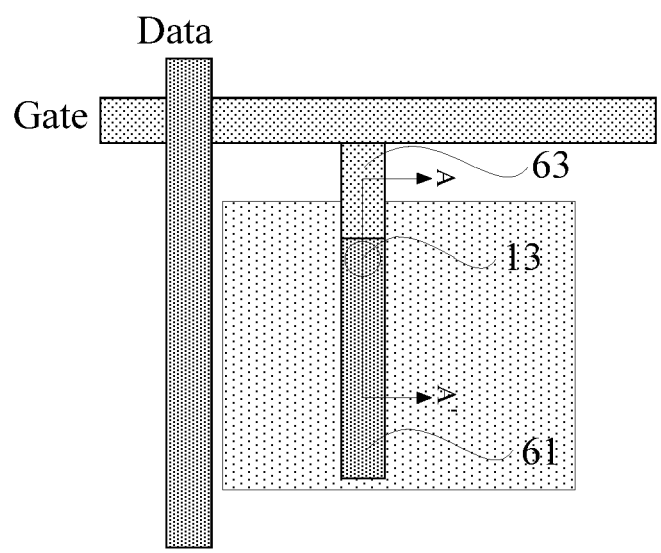
FIG. 8 is a partially enlarged view of FIG. 7.
Figure 9:
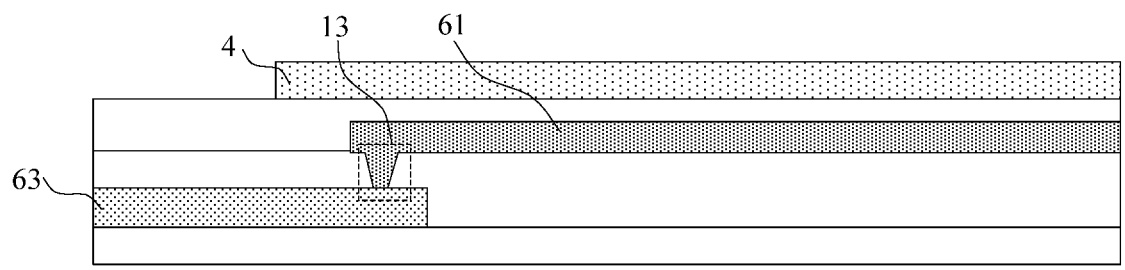
FIG. 9 is a cross-sectional view of FIG. 8 along A-A' direction.

Specifically, referring to FIGS. 7-9, where FIG. 9 is a cross-sectional view of FIG. 8 along A-A' direction, the plurality of first signal lines 5 includes gate lines Gate. Since the first lines 61 of the second signal lines 6 extend along a same direction as the data lines Data, the first lines 61 and the data lines Data can be arranged in a same layer. Therefore, the first lines 61 and the data lines Data can be formed by a same patterning process, instead of forming the first lines 61 in a separate patterning process, thereby simplifying the processing and thus reducing the manufacturing cost.

If the first lines 61 and the data lines Data are arranged in the same layer, the first lines 61 and the gate lines Gate can be in different layers. In this way, the gate lines Gate can be connected to the corresponding first lines 61 through a first through-hole 13.

Further, as shown in FIG. 8 and FIG. 9, the reflective layer portion 4 covers the first through-hole 13. Since the position of the gate line Gate corresponds to the non-opening region of the sub-pixel and the position of the reflective layer portion 4 corresponds to the opening region of the sub-pixel, the first through-hole 13 is actually arranged in the opening region if the reflective layer portion 4 covers the first through-hole 13. At this time, each of the second signal lines 6 further includes a third line 63 connected to a corresponding gate line Gate, and the third line 63 is also connected to a corresponding first line 61 through the first through-hole 13.

In addition, the third lines 63 and the gate lines Gate can be arranged in the same layer, and thus the third lines 63 and the gate lines Gate are formed by a same patterning process.

It should be noted that, the connection of the gate lines Gate and the first lines 61 through the first through-hole 13 is merely illustrative, that is, the gate lines Gate can also be connected to the first lines 61 through one or more segments of other lines, which will not be limited in the present disclosure.

Figure 10:
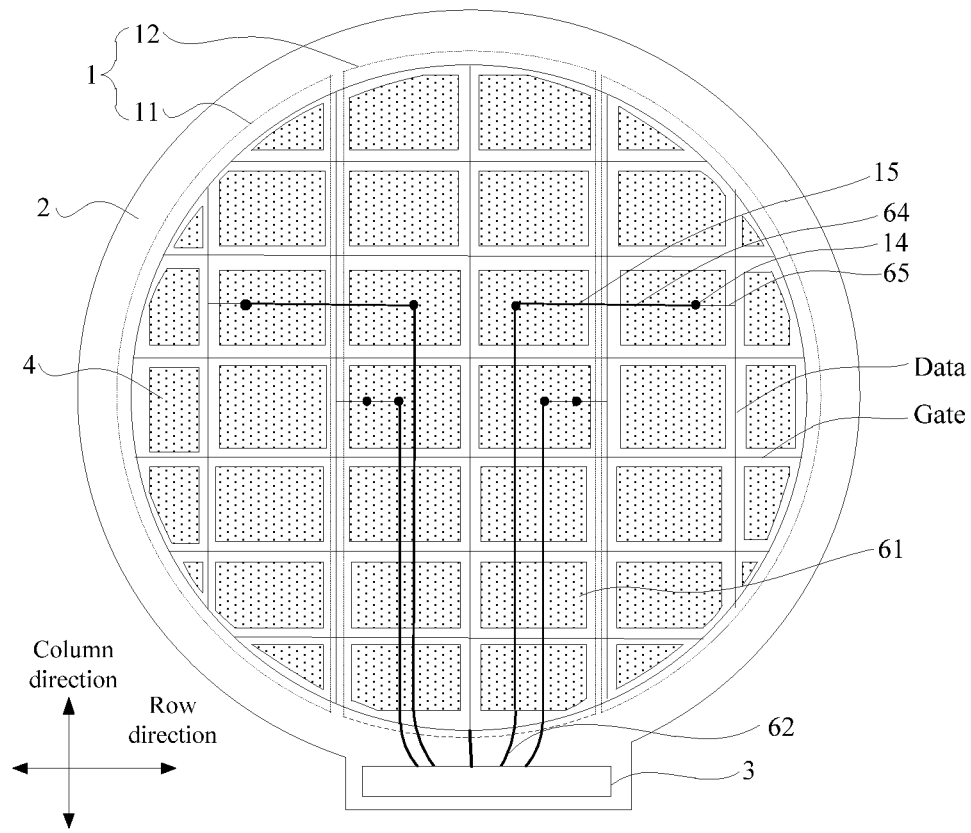
FIG. 10 is another schematic diagram of a connection between a first signal line and a second signal line in a display panel according to an embodiment of the present disclosure.
Figure 11:
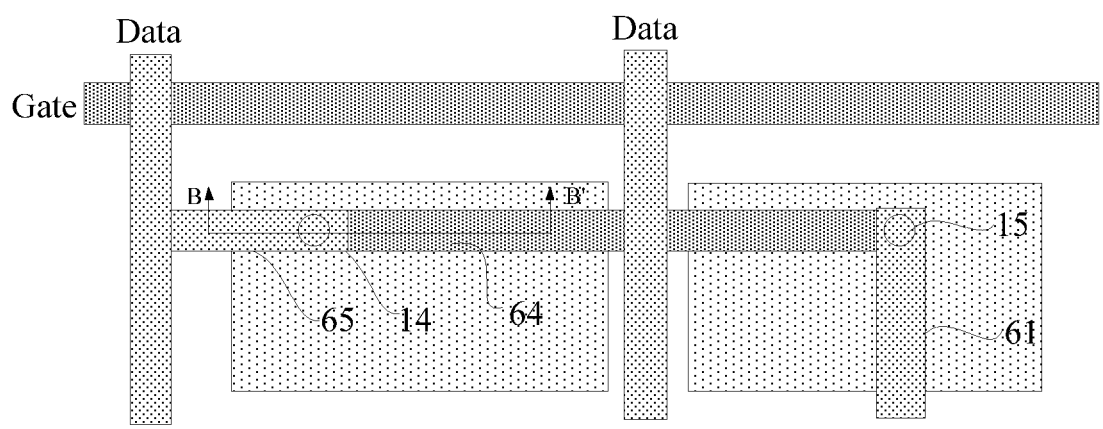
FIG. 11 is a partially enlarged view of FIG. 10.
Figure 12:
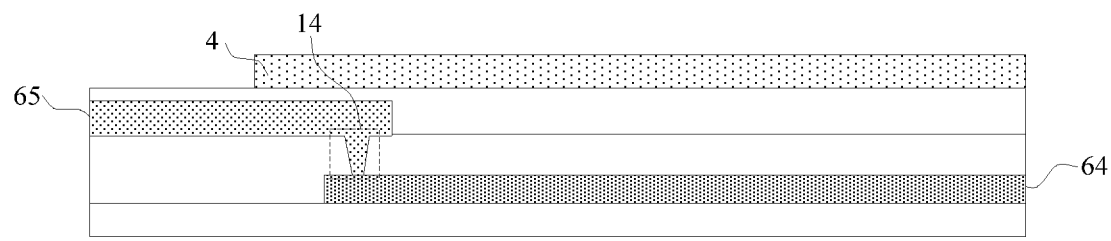
FIG. 12 is a cross-sectional view of FIG. 11 along B-B' direction.

In an embodiment as shown in FIGS. 10-12, where FIG. 12 is a cross-sectional view of FIG. 11 along B-B' direction, the plurality of first signal lines 5 include data lines Data, and the first lines 61 extend along a same direction as the data lines Data, so that the first lines 61 and the data lines Data can be arranged in the same layer. Therefore, in the processing, the first lines 61 and the data lines Data can be formed by a same patterning process, instead of forming the first lines 61 in a separate patterning process, thereby simplifying the processing and thus reducing the manufacturing cost.

Based on the arrangement of the data lines Data and the first lines 61, the data lines Data can also be connected to the corresponding first lines 61 through fourth lines 64, and the fourth lines 64 extend along the row direction. Since the data lines Data extend along the column direction and the fourth lines 64 extend along the row direction, the fourth lines 64 need to across multiple data lines Data. In order to avoid short circuit between the fourth lines 64 and the data lines Data, the fourth lines 64 and the data lines Data should be arranged in different layers. Moreover, since the fourth lines 64 and the gate lines Gate extend along a same direction, the fourth lines 64 and the gate lines Gate can be arranged in a same layer to simplify the processing and reduce cost.

If the fourth lines 64 and the gate lines Gate are arranged in the same layer, the data lines Data and the fourth lines 64 are in different layers, and the first lines 61 and the fourth lines 64 are also in different layers. In this case, the data line Data can be connected to a corresponding fourth line 64 through a second through-hole 14, and the fourth line 64 can be connected to a corresponding first line 61 through a third through-hole 15.

Further, as shown in FIG. 11 and FIG. 12, the reflective layer portion 4 covers the second through-hole 14 and the third through-hole 15. Since the position of the data lines Data corresponds to the non-opening region of the sub-pixel, while the position of the reflective layer portion 4 corresponds to the opening region of the sub-pixel, when the reflective layer portion 4 covers the second through-hole 14, the second through-hole 14 is actually arranged in the opening region. In this case, each of the second signal lines 6 further includes a fifth line 65 connected to a corresponding data line Data, and the fifth line 65 is also connected to a corresponding fourth line 64 through the second through-hole 14.

In addition, the fifth lines 65 and the data lines Data can be arranged in the same layer, and the fifth lines 65 and the data lines Data are formed by a same patterning process.

It should be noted that, the connection of the data lines Data and the first lines 61 through the fourth lines 64 is merely illustrative, that is, the data lines Data can also be connected to the first lines 61 through one or more segments of other lines, which will not be limited in the present disclosure.

In addition, as regards the second lines 62 arranged in the non-display area 2, in order to reduce the space occupied by the second lines 62 in the non-display area 2 and reduce the width of the frame, the plurality of second lines 62 can be arranged in different layers.

For example, the plurality of second lines 62 can be arranged in two layers, in which a portion of the second lines 62 and the gate lines Gate are arranged in the same layer, and the other portion of the second lines 62 and the data lines Data are arranged in the same layer. For example, in any two adjacent second lines 62, one of the two adjacent second lines 62 and the gate line Gate are arranged in the same layer, and the other one of the two adjacent second lines 62 and the data line Data are arranged in the same layer.

Figure 13:
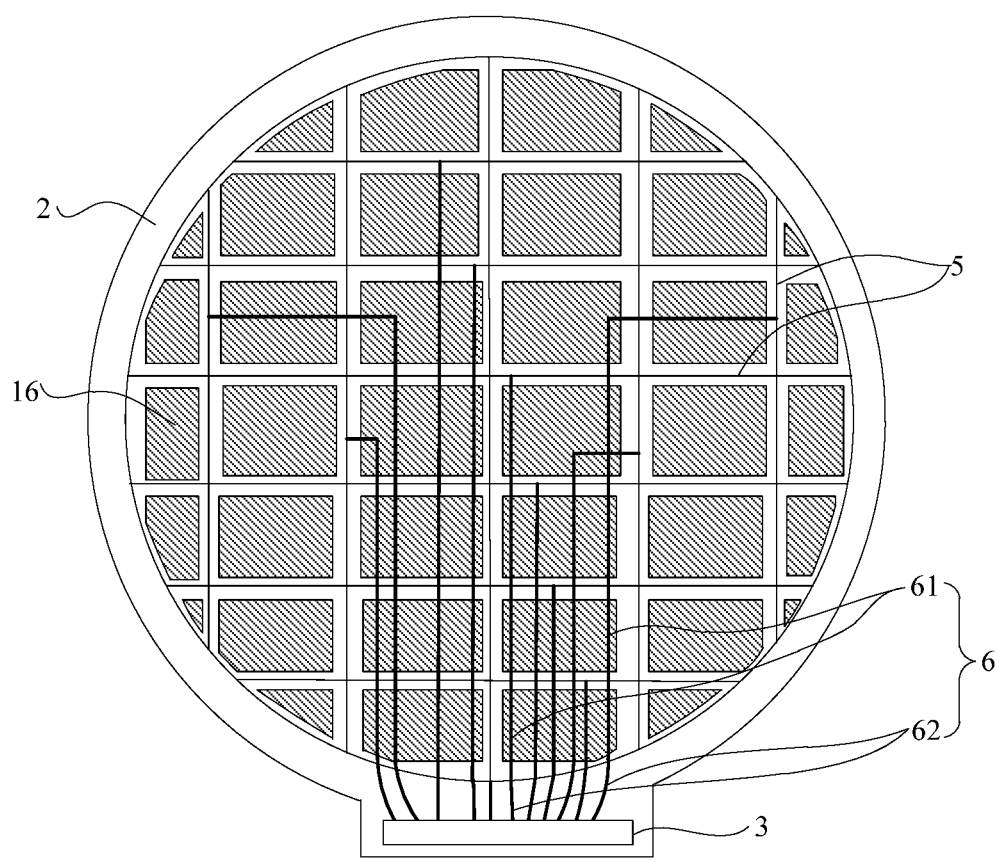
FIG. 13 is another schematic structural diagram of a display panel according to an embodiment of the present disclosure.

In addition, as show in FIG. 13, the display panel further includes a metal shielding layer 16 for shielding signal interference. The orthogonal projection of the first line 61 on the plane where the display panel is located partially overlaps an orthogonal projection of the metal shielding layer 16 on the plane where the display panel is located. At present, the shielding layer known in the related art is generally made of transparent material such as zinc tin oxide and the like. In the present disclosure, the metal shielding layer 16 is made of metallic material. Compared with the transparent material, manufacturing the shielding layer with the metallic material is a simple process, and the process time is short, which can improve manufacturing efficiency.

It should be noted that, when the display panel is a reflective display panel, in order to avoid the influence of the metal shielding layer on the normal light emission of the display panel, the metal shielding layer 16 should be located at a side of the reflective layer portion 4 facing away from the ambient light, and the metal shielding layer 16 shall be located between the reflective layer portion 4 and the first lines 61. Moreover, as for a total reflective display panel, the metal shielding layer 16 can be a metal layer extending over the entire surface, or a plurality of separate metal layers. For a transflective display panel, in order to prevent the metal shielding layer 16 from shielding the back light source, the metal shielding layer 16 includes a plurality of separate metal layers, and an orthogonal projection of one of the separate metal layers on the plane where the display panel is located is within the orthogonal projection of the reflective layer portion 4 on the plane where the display panel is located.

Furthermore, in order to reduce the manufacturing cost, the metal shielding layer 16 can also be a common electrode for transmitting common signal, or can also be a first electrode plate of a storage capacitor.

When the display panel includes the metal shielding layer 16, if the plurality of second lines 62 is arranged in different layers, then a portion of the second lines 62 and the metal shielding layer 16 can be arranged in a same layer. For example, a portion of the second lines 62 and the gate lines Gate are arranged in a same layer, another portion of the second lines 62 and the data lines Data are arranged in the same layer, and the rest of the second lines 62 and the metal shielding layer 16 are arranged in the same layer.

Figure 14:
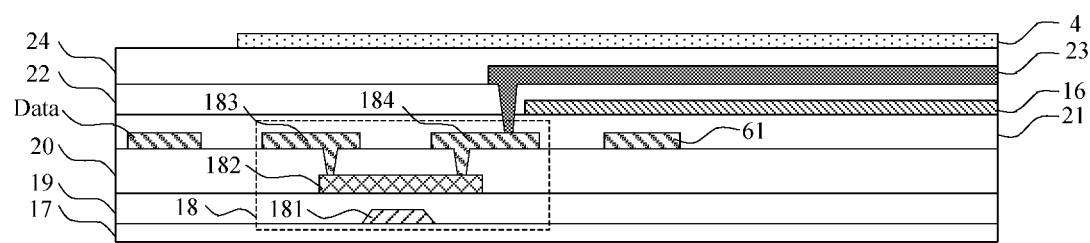
FIG. 14 is a schematic diagram of a film layer structure of a display panel according to an embodiment of the present disclosure.

Taking the liquid crystal display panel as an example, the display panel further includes a thin film transistor and a pixel electrode. Referring to FIG. 14, assuming that the plurality of first signal lines 5 includes gate lines Gate, and the first lines 61 and the data lines Data are arranged in a same layer, the film layer structure of the display panel and a manufacturing method thereof are described in detail as follows:

Step S1: forming gate lines (not shown) and a gate electrode 181 of a thin film transistor 18 on a base substrate 17;

Step S2: forming a first insulation layer 19, and forming an active layer 183 of the thin film transistor 18 on the first insulation layer 19;

Step S3: forming a second insulation layer 20, and forming the data lines Data, the first lines 61, a source electrode 183 and a drain electrode 184 of the thin film transistor 18 on the second insulation layer 20, where the source electrode 183 and the drain electrode 184 are connected to the active layer 182;

Step S4: forming a third insulation layer 21, and forming a metal shielding layer 16 on the third insulation layer 21;

Step S5: forming a fourth insulation layer 22, and forming a pixel electrode 23 on the fourth insulation layer 22, where the pixel electrode 23 is connected to the drain electrode 184 of the thin film transistor 18; and Step S6: forming a fifth insulation layer 24 and forming a reflective layer portion 4 on the fifth insulation layer 24.

Figure 15:
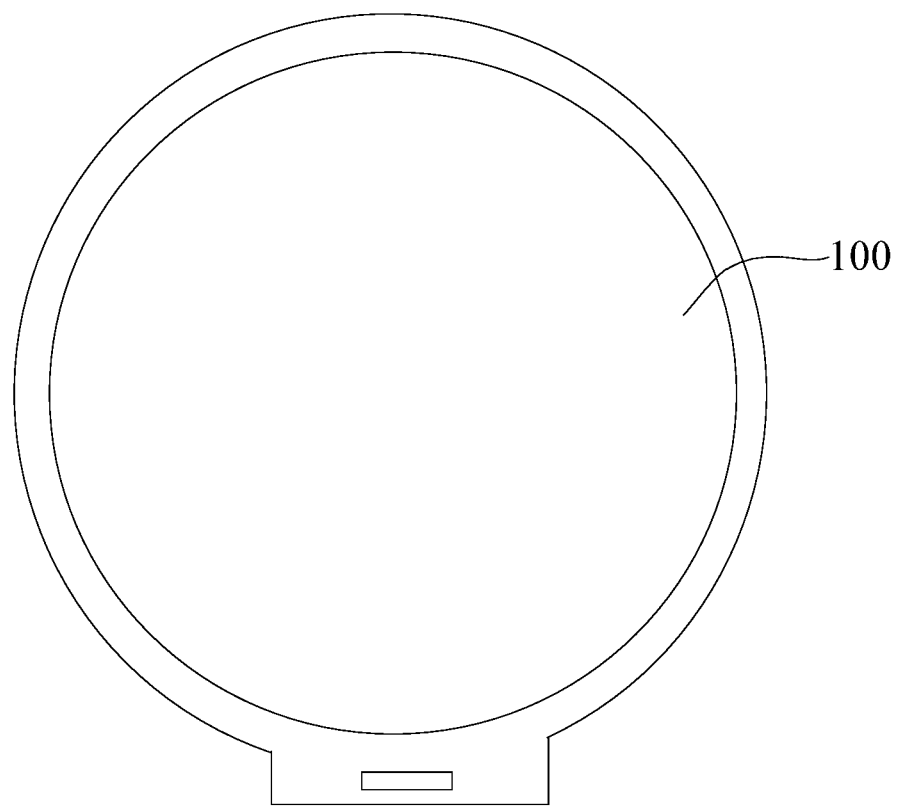
FIG. 15 is a schematic structural diagram of a display device according to an embodiment of the present disclosure.

The embodiments of the present disclosure further provide a display device, as shown in FIG. 15. The display device includes the display panel 100 as described above, and a driving chip (not shown) bonded in the chip bonding area of the display panel 100. The specific structure of the display panel 100 is the same as described in the above embodiments, which will not be repeated herein. The display device shown in FIG. 15 is only an example. The display device can be any electronic device having display function, such as cellphone, tablet PC, laptop, e-book or television etc.

Since the display device provided in the embodiments of the present disclosure includes the above display panel, based on the arrangement of the first lines in the display panel, the second lines in the non-display area are only arranged in the region of the non-display area corresponding to the second display area, but not in the region of the non-display area corresponding to the first display area. Therefore, in the display device, the space in the non-display area occupied by the second lines can be reduced to a certain extent, thereby reducing the frame width, and better achieving the narrow frame design of the display device.

In addition, since the second lines are concentrated in the display panel, the distance between the pins in the chip bonding area which are connected to the second lines can be set smaller, so as to reduce the width of the chip bonding area in the row direction. Accordingly, the distance between pins in the driving chip can be set smaller, so as to reduce the length of the driving chip in the row direction. For example, the length of the driving chip in the row direction can be smaller than 10 mm. For a wearable display device, in this arrangement, the appearance of the display panel more likely approaches a true round.

The above described embodiments are preferred embodiments of the present disclosure, which are not intended to limit the present disclosure. Any modification, equivalent replacement and improvement made within the spirit and principle of the present disclosure shall fall into the protection scope of the present disclosure.

What is claimed is:

1. A display panel, comprising a display area and a non-display area, wherein the non-display area comprises a chip bonding area, and the display area comprises a first display area and a second display area, wherein a distance between the second display area and the chip bonding area is smaller than a distance between the first display area and the chip bonding area,
- a plurality of reflective layer portions arranged in the display area, an orthogonal projection of each of the plurality of reflective layer portions on a plane where the display panel is located corresponds to an opening region of a sub-pixel,
- a plurality of first signal lines arranged in the display area, and each of the plurality of first signal lines has different lengths in the display area,
- wherein the display panel further comprises a plurality of second signal lines connected to the plurality of first signal lines in one-to-one correspondence, and the plurality of second signal lines is also connected to the chip bonding area,
- at least a portion of the plurality of second signal lines each at least comprises a first line and a second line, the first line is connected to a corresponding first signal line of the plurality of the first signal lines, and is further connected to the chip bonding area through the second line, wherein the first line is located in the second display area and extends along a column direction, an orthogonal projection of the first line on the plane where the display panel is located partially overlaps an orthogonal projection of a corresponding reflective layer portion of the plurality of reflective layer portions on the plane where the display panel is located, and the second line is located in the non-display area, and
- wherein the display area has a round shape, and the display area comprises two first display areas and one second display area, in a row direction, one of the two first display areas, the second display area and the other one of the two first display areas are arranged in sequence.

2. The display panel according to claim 1, wherein the plurality of first signal lines each comprises a gate line.

3. The display panel according to claim 1, wherein the plurality of first signal lines each comprises a gate line and a data line.

4. The display panel according to claim 3, wherein the first line and the data line are arranged in a same layer, and the gate line is connected to a corresponding first line via a first through-hole.

5. The display panel according to claim 4, wherein the plurality of reflective layer portions covers the first through-hole;
- the plurality of second signal lines each further comprises a third line, and the third line is connected to a corresponding gate line, the third line is further connected to a corresponding first line via the first through-hole, and the third line and the gate line are arranged in a same layer.

6. The display panel according to claim 1, wherein the plurality of first signal lines each comprises a data line.

7. The display panel according to claim 6, wherein the first line and the data line are arranged in a same layer.

8. The display panel according to claim 7, wherein the data line is connected to each first line in one-to-one correspondence through a fourth line, the fourth line extends along a row direction, and the fourth line and the gate line are arranged in a same layer,
- the data line is connected to a corresponding fourth line via a second through-hole, and the fourth line is connected to a corresponding first line via a third through-hole.

9. The display panel according to claim 8, wherein the plurality of reflective layer portions covers the second through-hole and the third through-hole,
- the plurality of second signal lines each further comprises a fifth line, and the fifth line is connected to a corresponding data line, the fifth line is further connected to a corresponding fourth line via the second through-hole, and the fifth line and the data line are arranged in a same layer.

10. The display panel according to claim 3, wherein the plurality of second lines is arranged in different layers, wherein a portion of the plurality of second lines and the gate line are arranged in a same layer, and another portion of the plurality of second lines and the data line are arranged in a same layer.

11. The display panel according to claim 1, further comprising a metal shielding layer, wherein the orthogonal projection of the first line on the plane where the display panel is located partially overlaps an orthogonal projection of the metal shield layer on the plane where the display panel is located.

12. The display panel according to claim 11, wherein the metal shielding layer is also a common electrode or is also a first electrode plate of a storage capacitor.

13. The display panel according to claim 11, wherein the plurality of second lines is arranged in different layers, wherein a portion of the plurality of second lines and the metal shielding layer are arranged in a same layer.

14. A display device, comprising a display panel and a driving chip bonded in a chip bonding area of the display panel,
- wherein the display panel comprises a display area and a non-display area, wherein the non-display area comprises the chip bonding area, and the display area comprises a first display area and a second display area, wherein a distance between the second display area and the chip bonding area is smaller than a distance between the first display area and the chip bonding area,
- a plurality of reflective layer portions is arranged in the display area, an orthogonal projection of each of the plurality of reflective layer portions on a plane where the display panel is located corresponds to an opening region of a sub-pixel,
- a plurality of first signal lines is arranged in the display area, and each of the plurality of first signal lines has different lengths in the display area,
- wherein the display panel further comprises a plurality of second signal lines connected to the plurality of first signal lines in one-to-one correspondence, and the plurality of second signal lines is also connected to the chip bonding area,
- at least a portion of the plurality of second signal lines each at least comprises a first line and a second line, the first line is connected to a corresponding first signal line of the plurality of the first signal lines, and is further connected to the chip bonding area through the second line, wherein the first line is located in the second display area and extends along a column direction, an orthogonal projection of the first line on the plane where the display panel is located partially overlaps an orthogonal projection of a corresponding reflective layer portion of the plurality of reflective layer portions on the plane where the display panel is located, and the second line is located in the non-display area, and wherein the display area has a round shape, and the display area comprises two first display areas and one second display area, in a row direction, one of the two first display areas, the second display area and the other one of the two first display areas are arranged in sequence.

15. The display device according to claim 14, wherein a length of the driving chip in a row direction is less than 10 mm.

\* \* \* \* \*